United States Patent
Koshi et al.

(10) Patent No.: US 9,915,010 B2
(45) Date of Patent: Mar. 13, 2018

(54) METHOD FOR CULTIVATING β-GA$_2$O$_3$-BASED SINGLE CRYSTAL, AND β-GA$_2$O$_3$-BASED SINGLE CRYSTAL SUBSTRATE AND METHOD FOR PRODUCING SAME

(71) Applicants: TAMURA CORPORATION, Tokyo (JP); KOHA CO., LTD., Tokyo (JP)

(72) Inventors: Kimiyoshi Koshi, Tokyo (JP); Takekazu Masui, Tokyo (JP); Masaru Takizawa, Tokyo (JP)

(73) Assignees: TAMURA CORPORATION, Tokyo (JP); KOHA CO., LTD., Tokyo (JP)

( * ) Notice: Subject to any disclaimer, the term of this patent is extended or adjusted under 35 U.S.C. 154(b) by 39 days.

(21) Appl. No.: 14/891,513

(22) PCT Filed: May 2, 2014

(86) PCT No.: PCT/JP2014/062199
§ 371 (c)(1),
(2) Date: Nov. 16, 2015

(87) PCT Pub. No.: WO2014/185304
PCT Pub. Date: Nov. 20, 2014

(65) Prior Publication Data
US 2016/0115621 A1    Apr. 28, 2016

(30) Foreign Application Priority Data
May 14, 2013 (JP) .................... 2013-102599

(51) Int. Cl.
C30B 15/34 (2006.01)
C30B 29/16 (2006.01)
C30B 15/36 (2006.01)

(52) U.S. Cl.
CPC .............. C30B 15/34 (2013.01); C30B 15/36 (2013.01); C30B 29/16 (2013.01)

(58) Field of Classification Search
CPC combination set(s) only.
See application file for complete search history.

(56) References Cited

U.S. PATENT DOCUMENTS 3,413,098 A * 11/1968 Dermatis ................ C30B 15/00
                                                      117/35
2004/0007708 A1    1/2004 Ichinose et al.
(Continued)

FOREIGN PATENT DOCUMENTS

CN  101320780 A  12/2008
CN  105229208 A  1/2016
(Continued)

OTHER PUBLICATIONS

Machine translation of JP2006-312571.*
(Continued)

Primary Examiner — Duy Vu N Deo
Assistant Examiner — Erin F Bergner
(74) Attorney, Agent, or Firm — Scully, Scott, Murphy & Presser, P.C.

(57) ABSTRACT

Provided is one embodiment which is a method for growing a β-Ga$_2$O$_3$-based single crystal which uses the EFG method and includes raising a Ga$_2$O$_3$ melt inside a crucible up to a die opening via a die slit such that a seed crystal is contacted with the Ga$_2$O$_3$-based melt in the opening of the die with a horizontal position of the seed crystal shifted in a width direction (W) from a center in the width direction (W) of the die, and pulling up the seed crystal contacting the Ga$_2$O$_3$-based melt so as to grown a β-Ga$_2$O$_3$ single crystal.

15 Claims, 9 Drawing Sheets

(56) References Cited

U.S. PATENT DOCUMENTS

| | | |
|---|---|---|
| 2006/0001031 A1 | 1/2006 | Ichinose et al. |
| 2008/0070337 A1 | 3/2008 | Ichinose et al. |
| 2008/0237607 A1 | 10/2008 | Ichinose et al. |
| 2010/0038652 A1 | 2/2010 | Ichinose et al. |
| 2013/0248902 A1 | 9/2013 | Ichinose et al. |
| 2014/0306237 A1 | 10/2014 | Ichinose et al. |
| 2016/0122899 A1 | 5/2016 | Koshi et al. |

FOREIGN PATENT DOCUMENTS

| | | |
|---|---|---|
| JP | 2006-312571 A | 11/2006 |
| JP | 2006-335616 A | 12/2006 |
| JP | 2013-082587 A | 5/2013 |
| JP | 2013-227160 A | 11/2013 |

OTHER PUBLICATIONS

International Search Report dated Jun. 10, 2014 issued in PCT/JP2014/062199.

Japanese Office Action dated Feb. 10, 2015 issued in JP 2013-102599, together with partial translation.

Japanese Office Action dated Mar. 3, 2015 issued in JP 2014-118823, together with partial translation.

Japanese Office Action dated Jul. 14, 2015 issued in JP 2013-102599, together with partial translation.

Japanese Office Action dated Jul. 7, 2015 issued in JP 2014-118823, together with partial translation.

Extended European Search Report dated Dec. 9, 2016 received in related application EP 14798117.9.

Aida, et al., "Growth of β-Ga2O3 Single Crystals by the Edge-Defined, Film Fed Growth Method", Japanese Journal of Applied Physics, vol. 47, No. 11, Jan. 1, 2008, pp. 8506-8509, XP008175225.

Chinese Office Action dated Jul. 13, 2017 received in Chinese Application No. 201480025539.0, together with an English-language translation.

* cited by examiner

FIG.5B 26 ((-201)PLANE)    27 ((100)PLANE)

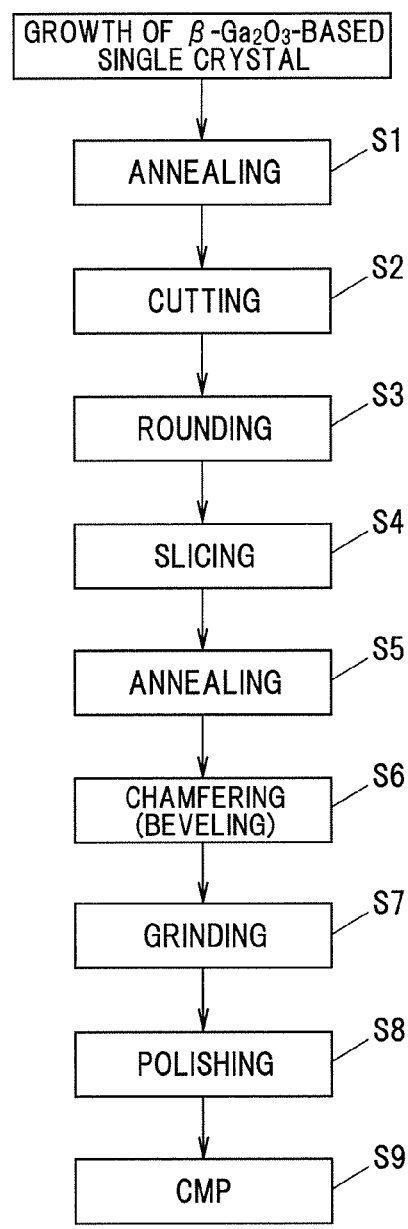

METHOD FOR CULTIVATING β-GA₂O₃-BASED SINGLE CRYSTAL, AND β-GA₂O₃-BASED SINGLE CRYSTAL SUBSTRATE AND METHOD FOR PRODUCING SAME

TECHNICAL FIELD

The invention relates to a method for growing a β-$Ga_2O_3$-based single crystal, a β-$Ga_2O_3$-based single crystal substrate and a method for producing the substrate.

BACKGROUND ART

Use of EFG technique to grow a $Ga_2O_3$ single crystal is known as a conventional method (see, e.g., PTL 1). In the method described in PTL 1, a $Ga_2O_3$ single crystal is grown while gradually widening a width thereof from a contact portion with a seed crystal toward the bottom, i.e., while widening the shoulder, thereby allowing a plate-shaped crystal having a larger width than the seed crystal to be obtained.

CITATION LIST

Patent Literature

[PTL 1]
JP-A 2006-312571

SUMMARY OF INVENTION

Technical Problem

The method disclosed in PTL 1, however, has a problem that the $Ga_2O_3$ single crystal is likely to be twinned during the process of widening the shoulder in a width direction.

Thus, it is an object of the invention to provide a method for growing a β-$Ga_2O_3$-based single crystal which allows obtainment of a wide β-$Ga_2O_3$-based seed crystal used for growing a flat plate-shaped β-$Ga_2O_3$-based single crystal such that the widening of the shoulder in the width direction is prevented. In addition, another object is to provide a method for producing a β-$Ga_2O_3$-based single crystal substrate by using the wide β-$Ga_2O_3$-based seed crystal obtained from the β-$Ga_2O_3$-based single crystal grown by the above-mentioned growth method. Still another object is to provide a β-$Ga_2O_3$-based single crystal substrate produced by the production method.

Solution to Problem

According to one embodiment of the invention, a method for growing a $Ga_2O_3$-based single crystal set forth in [1] to [7] below is provided so as to achieve the above object.

[1] A method for growing a β-$Ga_2O_3$-based single crystal, comprising:
using EFG method;
raising a $Ga_2O_3$-based melt inside a crucible up to an opening of a die via a slit of the die such that a seed crystal is contacted with the $Ga_2O_3$-based melt in the opening of the die with a horizontal position of a seed crystal shifted in a width direction from a center in the width direction of the die; and
pulling up the seed crystal contacting the $Ga_2O_3$-based melt so as to grow a β-$Ga_2O_3$-based single crystal.

[2] The method for cultivating a β-$Ga_2O_3$-based single crystal according to [1], wherein the seed crystal is contacted with the $Ga_2O_3$-based melt in the opening of the die with the horizontal position of the seed crystal located above an edge of the die in the width direction.

[3] The method for cultivating a β-$Ga_2O_3$-based single crystal according to [1] or [2], wherein the β-$Ga_2O_3$-based single crystal is grown in a b-axis direction.

[4] The method for cultivating a β-$Ga_2O_3$-based single crystal according to [1] or [2], wherein the β-$Ga_2O_3$-based single crystal comprises a flat plate-shaped single crystal having a (101) plane, a (−201) plane or a (001) plane as a principal surface.

[5] The method for cultivating a β-$Ga_2O_3$-based single crystal according to [1] or [2], further comprising:
cutting out a second seed crystal from the β-$Ga_2O_3$-based single crystal;
raising a second $Ga_2O_3$-based melt inside a second crucible up to an opening of a second die via a slit of the second die such that the second seed crystal is contacted with the second $Ga_2O_3$-based melt in the opening of the second die; and
pulling up the second seed crystal contacting the second $Ga_2O_3$-based melt so as to grow a second β-$Ga_2O_3$-based single crystal to be a flat plate-shaped after widening the shoulder in the thickness direction.

[6] The method for cultivating a β-$Ga_2O_3$-based single crystal according to [5], wherein the second seed crystal is cut out from a region between a first region and one of two edges of the β-$Ga_2O_3$-based single crystal in the width direction that is located farther from the first region, the first region being located immediately below the seed crystal during the growth of the β-$Ga_2O_3$-based single crystal.

[7] The method for cultivating a β-$Ga_2O_3$-based single crystal according to [5], further comprising:
cutting out a third seed crystal from the second β-$Ga_2O_3$-based single crystal;
raising a third $Ga_2O_3$-based melt inside a third crucible up to an opening of a third die via a slit of the third die such that the third seed crystal is contacted with the third $Ga_2O_3$-based melt in the opening of the third die; and
pulling up the third seed crystal contacting the third $Ga_2O_3$-based melt so as to grow a third β-$Ga_2O_3$-based single crystal.

According to another embodiment of the invention, a method for producing a $Ga_2O_3$-based single crystal substrate set forth in [8] to [9] below is provided so as to achieve the above object.

[8] A method for producing a β-$Ga_2O_3$-based single crystal substrate, comprising processing the second β-$Ga_2O_3$-based single crystal according to [5] into a β-$Ga_2O_3$-based single crystal substrate.

[9] A method for producing a β-$Ga_2O_3$-based single crystal substrate, comprising processing the third β-$Ga_2O_3$-based single crystal according to [7] into a β-$Ga_2O_3$-based single crystal substrate.

According to another embodiment of the invention, a $Ga_2O_3$-based single crystal substrate set forth in [10] to [11] below is provided so as to achieve the above object.

[10] A β-$Ga_2O_3$-based single crystal substrate produced by the method for producing a β-$Ga_2O_3$-based single crystal substrate according to [8].

[11] A β-$Ga_2O_3$-based single crystal substrate produced by the method for producing a β-$Ga_2O_3$-based single crystal substrate according to [9].

Advantageous Effects of the Invention

According to the invention, it is possible to provide a method for growing a β-Ga₂O₃-based single crystal which allows obtainment of a wide β-Ga₂O₃-based seed crystal used for growing a flat plate-shaped β-Ga₂O₃-based single crystal such that the widening of the shoulder in the width direction is prevented. Also, it is possible to provide a method for producing a β-Ga₂O₃-based single crystal substrate by using the wide β-Ga₂O₃-based seed crystal obtained from the β-Ga₂O₃-based single crystal grown by the above-mentioned growth method. Also, it is possible to provide a β-Ga₂O₃-based single crystal substrate produced by the production method.

BRIEF DESCRIPTION OF DRAWINGS

FIG. 5B is a horizontal cross sectional view showing the β-Ga₂O₃-based single crystal of FIG. 5A.

FIG. 9 is a flowchart showing an example of a process of producing a β-Ga₂O₃-based single crystal substrate in the embodiment.

DESCRIPTION OF EMBODIMENT

Embodiment

Figure 1:
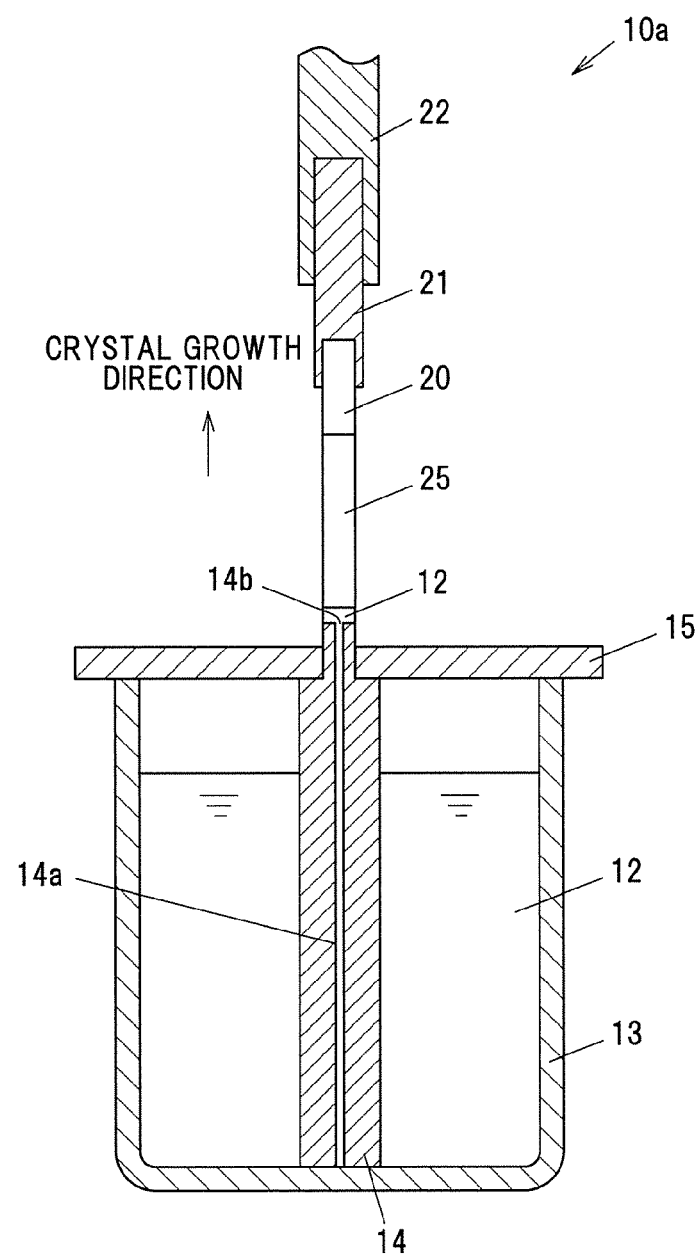
FIG. 1 is a vertical cross sectional view showing a part of an EFG crystal manufacturing apparatus in an embodiment.

FIG. 1 is a vertical cross sectional view showing a part of an EFG crystal manufacturing apparatus in the embodiment. This EFG crystal manufacturing apparatus 10a has a crucible 13 containing a Ga₂O₃-based melt 12, a die 14 placed in the crucible 13 and having a slit 14a, a lid 15 covering an opening of the crucible 13 so that the top surface of the die 14 including an opening 14b is exposed, a seed crystal holder 21 for holding a β-Ga₂O₃-based seed crystal (hereinafter, referred as "seed crystal") 20 and a shaft 22 vertically movably supporting the seed crystal holder 21.

The crucible 13 contains the Ga₂O₃-based melt 12 which is obtained by melting a Ga₂O₃-based raw material. The crucible 13 is formed of a highly heat-resistant material, such as iridium, capable of containing the Ga₂O₃-based melt 12.

The die 14 has the slit 14a to draw up the Ga₂O₃-based melt 12 in the crucible 13 by capillary action. The die 14 is formed of a highly heat-resistant material such as iridium in the same manner as the crucible 13.

The lid 15 prevents the high-temperature Ga₂O₃-based melt 12 from evaporating from the crucible 13 and further prevents the evaporated substances from attaching to members located outside of the crucible 13.

Figure 2:
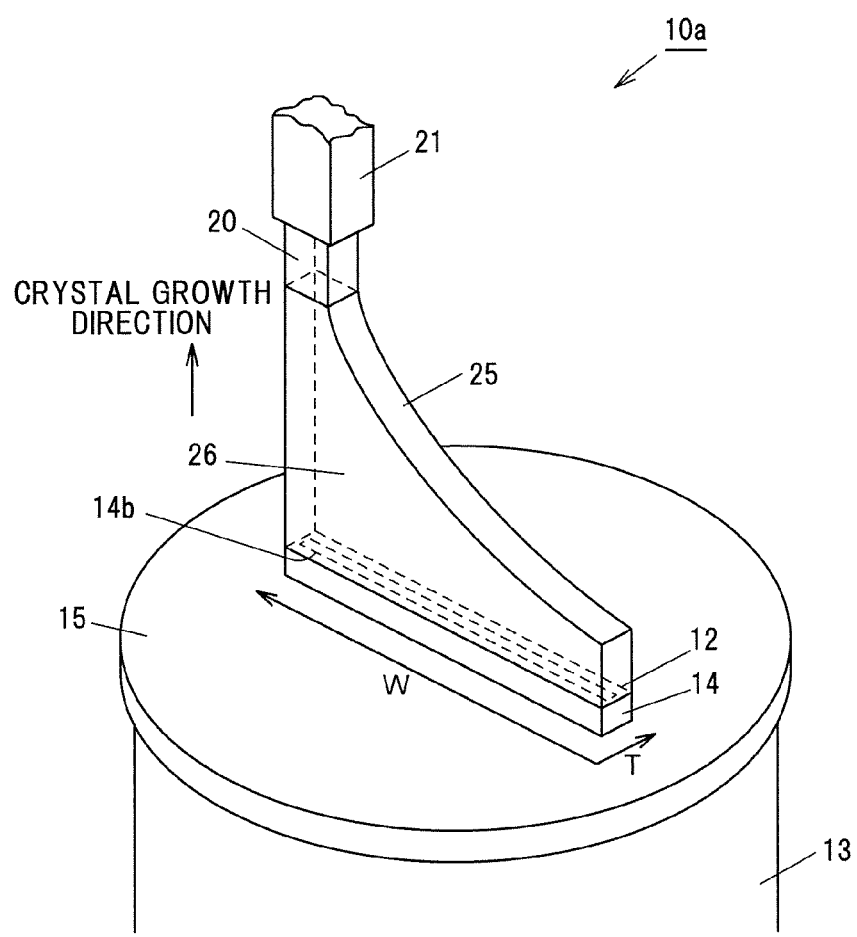
FIG. 2 is a perspective view showing a state during growth of a β-Ga₂O₃-based single crystal in the embodiment.

FIG. 2 is a perspective view showing a state during growth of the β-Ga₂O₃-based single crystal in the embodiment.

Here, a width direction and a thickness direction of the die 14 are respectively defined as a width direction W and a thickness direction T. The width direction W is perpendicular to the growth direction of a β-Ga₂O₃-based single crystal 25 as well as parallel to a principal surface 26. Meanwhile, the thickness direction T is parallel to a thickness direction of the flat plate-shaped β-Ga₂O₃-based single crystal 25.

Firstly, the Ga₂O₃-based melt 12 in the crucible 13 is drawn up to the opening 14b of the die 14 through the slit 14a of the die 14, and the seed crystal 20 is then brought into contact with the Ga₂O₃-based melt 12 present in the opening 14b of the die 14 in a state that a horizontal position of the seed crystal 20 is shifted in the width direction W from the center of the die 14 in the width direction W. In this regard, more preferably, the seed crystal 20 is brought into contact with the Ga₂O₃-based melt 12 covering the top surface of the die 14 in a state that the horizontal position of the seed crystal 20 is located above an edge of the die 14 in the width direction W.

Next, the seed crystal 20 in contact with the Ga₂O₃-based melt 12 is pulled vertically upward, thereby growing the β-Ga₂O₃-based single crystal 25.

FIG. 2 shows a state in which the seed crystal 20 is brought into contact with the Ga₂O₃-based melt 12 covering the top surface of the die 14 and is then pulled up in a state that the horizontal position of the seed crystal 20 is located above an edge of the die 14 in the width direction W.

The crystal orientation of the β-Ga₂O₃-based single crystal 25 is the same as the crystal orientation of the seed crystal 20. The principal surface 26 of the β-Ga₂O₃-based single crystal 25 is, e.g., a (101) plane, a (−201) plane or a (001) plane when grown in the b-axis direction, and is a (010) plane when grown in the c-axis direction.

The β-Ga₂O₃-based single crystal 25 and the seed crystal 20 are β-Ga₂O₃ single crystals, or are β-Ga₂O₃ single crystals doped with an element such as Mg, Fe, Cu, Ag, Zn, Cd, Al, In, Si, Ge, Sn or Nb.

Figure 3:
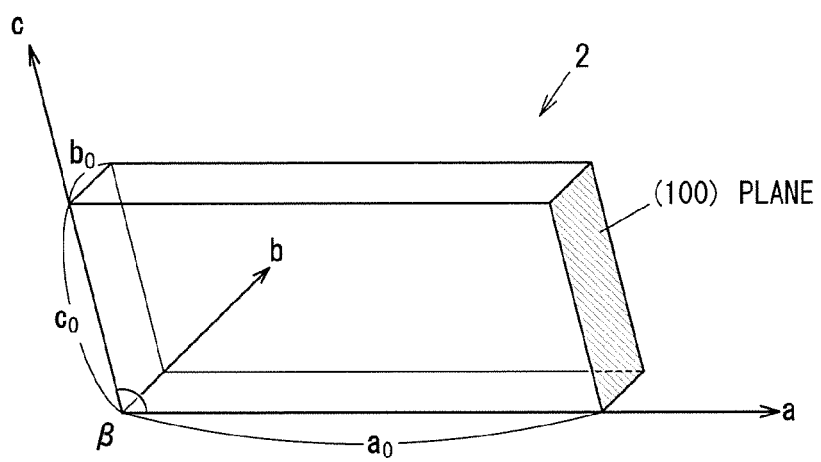
FIG. 3 is an illustration diagram showing a unit cell of the β-Ga₂O₃-based single crystal.

FIG. 3 is an illustration diagram showing a unit cell of the β-Ga₂O₃-based crystal. A unit cell 2 in FIG. 3 is a unit cell of the β-Ga₂O₃-based crystal. The β-Ga₂O₃-based crystal has a β-gallia structure belonging to the monoclinic system and the typical lattice constants of β-Ga₂O₃ crystal not containing impurities are $a_0=12.23$ Å, $b_0=3.04$ Å, $c_0=5.80$ Å, $\alpha=\gamma=90°$ and $\beta=103.8°$.

The β-Ga₂O₃-based single crystal has high cleavability on the (100) plane, and twins with the (100) plane as a twinning plane (a plane of symmetry) are likely to be formed in the shoulder widening process during crystal growth. Therefore, it is preferable to grow the β-Ga₂O₃-based single crystal 25 in a direction in which the (100) plane is parallel to the growth direction of the β-Ga₂O₃-based single crystal 25, e.g., to grow in a b-axis direction or a c-axis direction so that the size of a crystal without twins cut out from the β-Ga$_2$O$_3$-based single crystal 25 is maximized.

It is preferable to grow the β-Ga$_2$O$_3$-based single crystal 25 especially in the b-axis direction since the β-Ga$_2$O$_3$-based single crystal is liable to grow in the b-axis direction.

The feature of the present embodiment is that the seed crystal 20 is brought into contact with the Ga$_2$O$_3$-based melt 12 present in the opening 14b of the die 14 and is then pulled up in a state that the horizontal position of the seed crystal 20 is shifted in the width direction W from the center of the die 14 in the width direction W. This feature of the present embodiment will be described below in comparison with the conventional method.

Figure 4A:
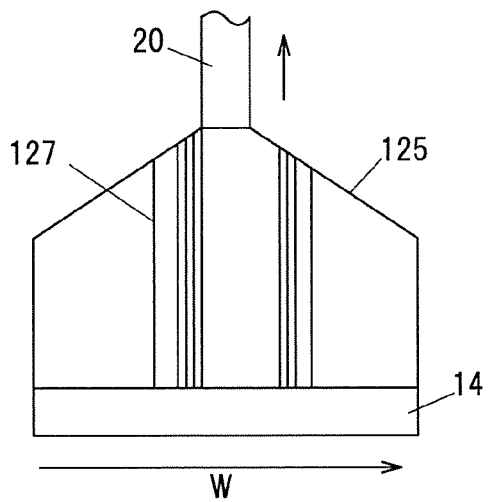
FIG. 4A is a side view showing a state during growth of a β-Ga₂O₃-based single crystal in Comparative Example.

FIG. 4A is a side view showing a state during growth of a β-Ga$_2$O$_3$-based single crystal 125 in Comparative Example. The β-Ga$_2$O$_3$-based single crystal 125 is a single crystal grown by the conventional method, i.e., grown by bringing the seed crystal 20 into contact with the Ga$_2$O$_3$-based melt 12 present in the opening 14b of the die 14 and is then pulled up in a state that the horizontal position of the seed crystal 20 is located above the center of the die 14 in the width direction W.

The horizontal center position of the die 14 is substantially coincident with the horizontal center position of the crucible 13. Therefore, temperature distribution of the Ga$_2$O$_3$-based melt 12 covering the top surface of the die 14 is symmetry in the width direction W with respect to the center position of the die 14 in the width direction W. Thus, it is easy to control temperature during crystal growth when bringing the seed crystal into contact with a portion at the center of the temperature distribution. For this reason, the method shown in FIG. 4A is conventionally used.

Twining planes 127 in the β-Ga$_2$O$_3$-based single crystal 125 are formed in the process of widening the shoulder in the width direction W during growth of the β-Ga$_2$O$_3$-based single crystal 125. If there is no twinning plane in the seed crystal 20, the twining plane 127 is hardly formed in a region of the β-Ga$_2$O$_3$-based single crystal 125 immediately below the seed crystal 20.

Figure 4B:
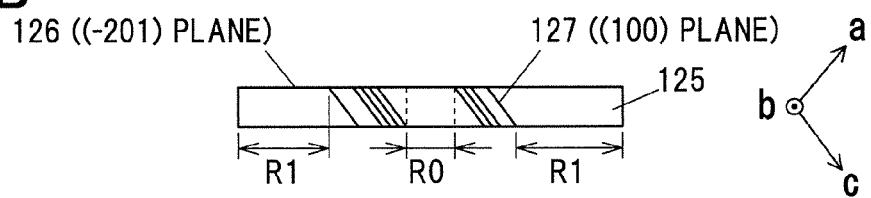
FIG. 4B is a horizontal cross sectional view showing the β-Ga₂O₃-based single crystal in Comparative Example.

FIG. 4B is a horizontal cross sectional view showing the β-Ga$_2$O$_3$-based single crystal 125. FIG. 4B is a schematic diagram when plane orientation of a principal surface 126 of the β-Ga$_2$O$_3$-based single crystal 125 is (−201). A region R0 shown in FIG. 4B is a region located immediately below the seed crystal 20 during the growth of the β-Ga$_2$O$_3$-based single crystal 125.

Figure 4C:
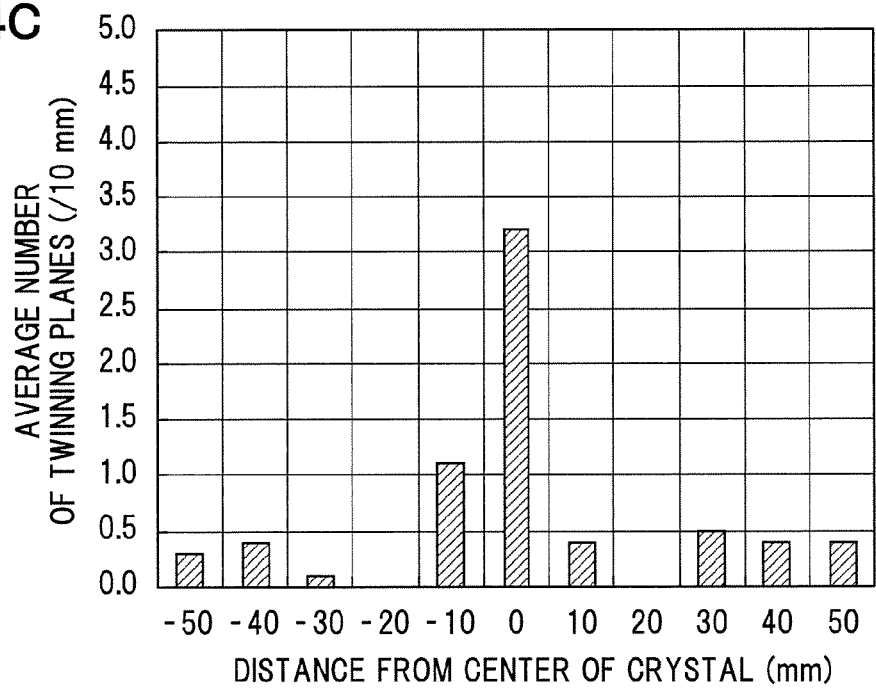
FIG. 4C is a graph showing a relation between a distance from the widthwise center and the number of twinning planes in the β-Ga₂O₃-based single crystal in Comparative Example.

FIG. 4C is a graph showing a relation between a distance from the center in the width direction W and the number of twinning planes in the β-Ga$_2$O$_3$-based single crystal 125. In FIG. 4C, the horizontal axis indicates a distance from the center of the β-Ga$_2$O$_3$-based single crystal 125 in the width direction W, and the vertical axis indicates the number of the twinning planes 127 in a region of 10 mm width of which center is a distance indicated on the horizontal axis. The number of the twinning planes 127 shown in FIG. 4C is the average of ten β-Ga$_2$O$_3$-based single crystals 125 having a (−201)-oriented principal surface.

FIG. 4C shows that the number of the twinning planes 127 in the β-Ga$_2$O$_3$-based single crystal 125 is larger when closer to the seed crystal 20 and twinning planes are less likely to be formed at a position distant from the seed crystal 20. A β-Ga$_2$O$_3$-based single crystal not containing twins can be obtained from the β-Ga$_2$O$_3$-based single crystal 125 shown in FIG. 4B by cutting out regions R1 located at both ends in the width direction W and not containing the twinning planes 127.

The present embodiment uses the properties of the β-Ga$_2$O$_3$-based single crystal that twinning planes are less likely to be formed at a position distance from a seed crystal. In the present embodiment, since the β-Ga$_2$O$_3$-based single crystal 25 is grown in a state that the horizontal position of the seed crystal 20 is shifted in the width direction W from the center of the die 14 in the width direction W, there are large and small regions on both sides of the region located immediately below the seed crystal 20 during the growth of the β-Ga$_2$O$_3$-based single crystal 25, and twinning planes are less likely to be formed in the larger-area region on the edge side which is far from the seed crystal 20.

Figure 5A:
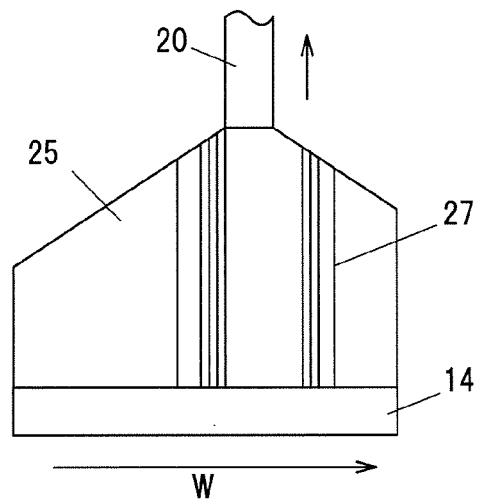
FIG. 5A is a side view showing a state during growth of the β-Ga₂O₃-based single crystal in the embodiment.
Figure 5A:
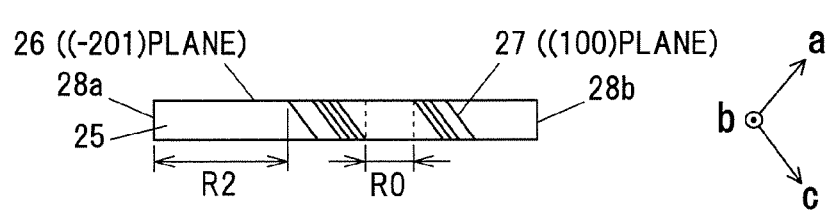

FIG. 5A is a side view showing a state during growth of the β-Ga$_2$O$_3$-based single crystal 25 in the embodiment. FIG. 5B is a horizontal cross sectional view showing the β-Ga$_2$O$_3$-based single crystal 25 of FIG. 5A. FIG. 5B is a schematic diagram when plane orientation of the principal surface 26 of the β-Ga$_2$O$_3$-based single crystal 25 is (−201). The region R0 shown in FIG. 5B is a region located immediately below the seed crystal 20 during the growth of the β-Ga$_2$O$_3$-based single crystal 25.

The β-Ga$_2$O$_3$-based single crystal 25 shown in FIGS. 5A and 5B is grown in a state that the horizontal position of the seed crystal 20 is shifted in the width direction W from the center of the die 14 in the width direction W.

In the β-Ga$_2$O$_3$-based single crystal 25 having two edges 28a and 28b in the width direction W, the width of a portion not containing twinning planes is larger in a region between the region R0 and the edge 28a farther from the region R0 (in a region on the left side of the region R0) than in a region between the region R0 and the edge 28b closer to the region R0 (in a region on the right side of the region R0).

Thus, a β-Ga$_2$O$_3$-based single crystal not containing twins can be cut out from a region R2 which is in the region between the region R0 and the edge 28a and does not contain twining planes 27.

Figure 6A:
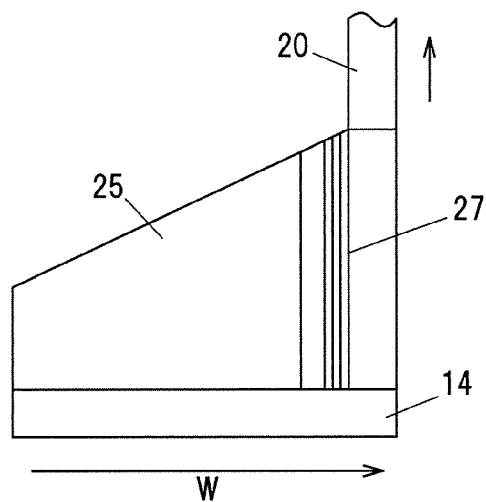
FIG. 6A is a side view showing a state during growth of the β-Ga₂O₃-based single crystal in a modification of the embodiment.
Figure 6B:
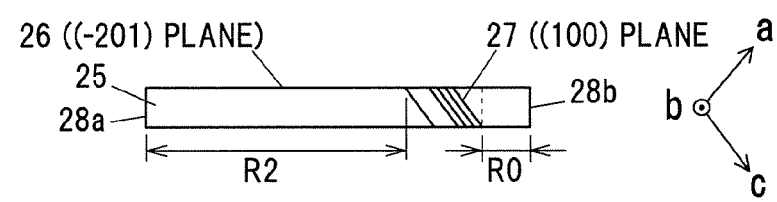
FIG. 6B is a horizontal cross sectional view showing the β-Ga₂O₃-based single crystal of FIG. 6A.

FIG. 6A is a side view showing a state during growth of the β-Ga$_2$O$_3$-based single crystal 25 in a modification of the embodiment. FIG. 6B is a horizontal cross sectional view showing the β-Ga$_2$O$_3$-based single crystal 25 of FIG. 6A. FIG. 6B is a schematic diagram when plane orientation of the principal surface 26 of the β-Ga$_2$O$_3$-based single crystal 25 is (−201).

The β-Ga$_2$O$_3$-based single crystal 25 shown in FIGS. 6A and 6B is grown in a state that the horizontal position of the seed crystal 20 is located above an edge of the die 14 in the width direction W.

In this example, the region R0 is located on the edge 28b and an area of the region between the region R0 and the edge 28b is thus zero and, on the other hand, the larger region R2 not containing twinning planes is present in the region between the region R0 and the edge 28a. Therefore, a larger β-Ga$_2$O$_3$-based single crystal not containing twins can be cut out from the region R2.

The regions R2 of the β-Ga$_2$O$_3$-based single crystals 25 shown in FIGS. 5B and 6B have a larger width than the region R1 of the β-Ga$_2$O$_3$-based single crystal 125. Therefore, a β-Ga$_2$O$_3$-based single crystal, which can be cut out from the β-Ga$_2$O$_3$-based single crystal 25 and does not contain twins, has a larger width than a β-Ga$_2$O$_3$-based single crystal which can be cut out from the β-Ga$_2$O$_3$-based single crystal 125 and does not contain twins.

The width of the regions R2 shown in FIGS. 5B and 6B depends on a diameter of a final β-Ga$_2$O$_3$-based single crystal substrate. When producing a β-Ga$_2$O$_3$-based single crystal substrate having a diameter of, e.g., 2 inches, the width of the region R2 is preferably larger than 2 inches.

The β-Ga$_2$O$_3$-based single crystal cut out from the β-Ga$_2$O$_3$-based single crystal 25 and not containing twins is used as a wide β-Ga$_2$O$_3$-based seed crystal in growth of a flat plate-shaped β-Ga$_2$O$_3$-based crystal with the minimized shoulder widening in the width direction W. However, a crystal cut out from the β-Ga$_2$O$_3$-based single crystal 25 does not necessarily need to be a crystal not containing twins at all, and a crystal containing a few twins at edges in the width direction W is acceptable. This is because, for example, presence of twins in the vicinity of the rim of the final β-Ga$_2$O$_3$-based single crystal substrate hardly causes a problem.

Also, plural β-Ga$_2$O$_3$-based seed crystals can be obtained when the β-Ga$_2$O$_3$-based single crystal cut out from the β-Ga$_2$O$_3$-based single crystal 25 and not containing twins is cut so as to separate in the growth direction of the β-Ga$_2$O$_3$-based single crystal 25.

Figure 7:
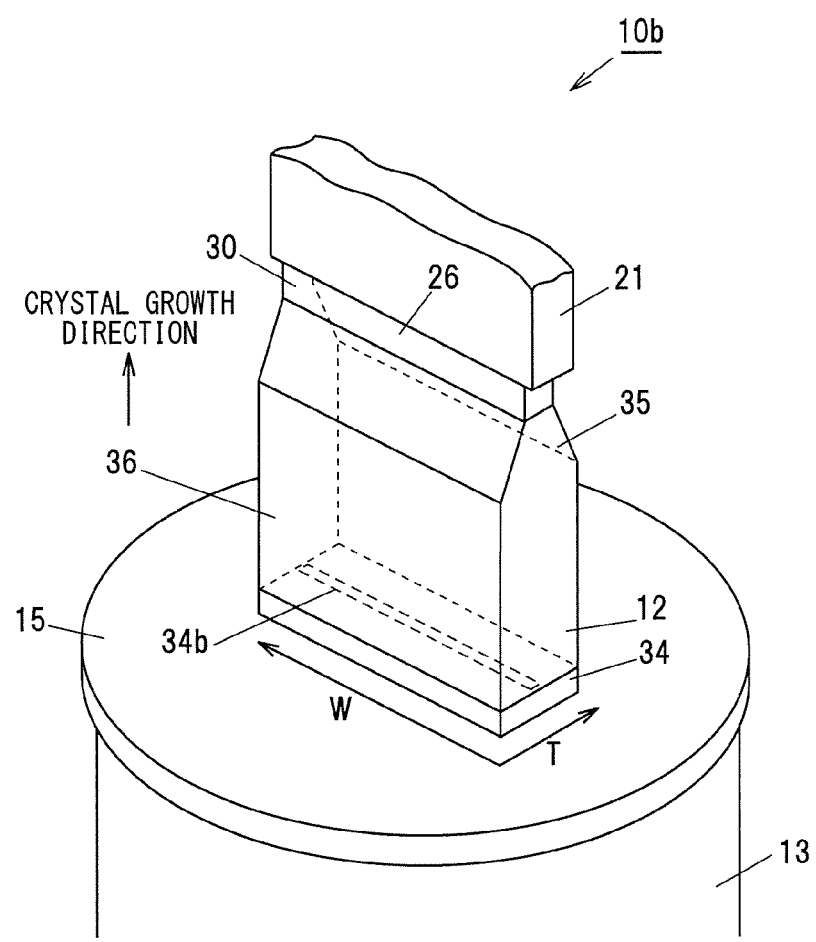
FIG. 7 is a perspective view showing a state during growth of a new β-Ga₂O₃-based single crystal using a seed crystal cut out from the β-Ga₂O₃-based single crystal in the embodiment.

FIG. 7 is a perspective view showing a state during growth of a new β-Ga$_2$O$_3$-based single crystal 35 using a seed crystal 30 cut out from the β-Ga$_2$O$_3$-based single crystal 25.

The seed crystal 30 is a β-Ga$_2$O$_3$-based single crystal which is cut out from the β-Ga$_2$O$_3$-based single crystal 25 and does not contain or hardly contains twins. When the seed crystal 30 is cut out from the region R2 of the β-Ga$_2$O$_3$-based single crystal 25, the width (the dimension in the width direction W) of the seed crystal 30 is equal to the width of the region R2.

Since the growth of the β-Ga$_2$O$_3$-based single crystal 35 does not involve a process of widening the shoulder in the width direction W, the width of the β-Ga$_2$O$_3$-based single crystal 35 is substantially equal to the width of the seed crystal 30. In addition, since the shoulder of the β-Ga$_2$O$_3$-based single crystal 35 is not widened in the width direction W, the width of a die 34 is preferably not more than the width of the seed crystal 30. In addition, the width of the die 34 is equal to or smaller than the width of the die 14.

On the other hand, since the growth of the β-Ga$_2$O$_3$-based single crystal 35 involves a process of widening the shoulder in the thickness direction T, the β-Ga$_2$O$_3$-based single crystal 35 becomes thicker than the seed crystal 30. For example, the β-Ga$_2$O$_3$-based single crystal 35 of 18 mm in thickness is grown from the seed crystal 30 of 6 mm in thickness. In addition, the thickness of the die 34 is larger than that of the seed crystal 30 so that the shoulder of the β-Ga$_2$O$_3$-based single crystal 35 can be widened in the thickness direction T. In addition, the thickness of the die 34 is larger than that of the die 14.

Twins are less likely to occur in the β-Ga$_2$O$_3$-based single crystal 35 even when widening the shoulder in the thickness direction T, unlike the shoulder widening in the width direction W.

By growing the β-Ga$_2$O$_3$-based single crystal 35 in a state that the principal surface 26 of the seed crystal 30 is perpendicular to the horizontal plane, the plane orientation of a principal surface 36 of the β-Ga$_2$O$_3$-based single crystal 35 can be made to coincide with the plane orientation of the principal surface 26 of the β-Ga$_2$O$_3$-based single crystal 25. For example, by using the seed crystal 30 cut out from the β-Ga$_2$O$_3$-based single crystal 25 having the principal surface 26 oriented to (101), (−201) or (001), it is possible to grow the β-Ga$_2$O$_3$-based single crystal 35 having the principal surface 36 oriented to (101), (−201) or (001).

A seed crystal thicker than the seed crystal 30 can be cut out from a flat plate-shaped region of the β-Ga$_2$O$_3$-based single crystal 35 formed after widening the shoulder. An example of such a method will be described below.

After growing the β-Ga$_2$O$_3$-based single crystal 35 having a flat plate-shaped portion of, e.g., 18 mm in thickness, the β-Ga$_2$O$_3$-based single crystal 35 is separated from the seed crystal 30 and the β-Ga$_2$O$_3$-based single crystal 35 is cut at intervals of 20 to 40 mm along a direction perpendicular to the growth direction. Firstly, the β-Ga$_2$O$_3$-based single crystal 35 is fixed to a carbon stage via heat-melting wax. The β-Ga$_2$O$_3$-based single crystal 35 fixed to the carbon stage is set on a cutting machine and is cut with a diamond blade. The grit number of the diamond blade is preferably about #200 to #600 (defined by JIS B 4131) and a cutting rate is preferably about 6 to 10 mm per minute. After cutting, the separated seed crystal 30 and the β-Ga$_2$O$_3$-based single crystals 35 cut at intervals of 20 to 40 mm along a direction perpendicular to the growth direction are detached from the carbon stage by heating. Each of the β-Ga$_2$O$_3$-based single crystals 35 cut at intervals of 20 to 40 mm is used as a new seed crystal.

Figure 8:
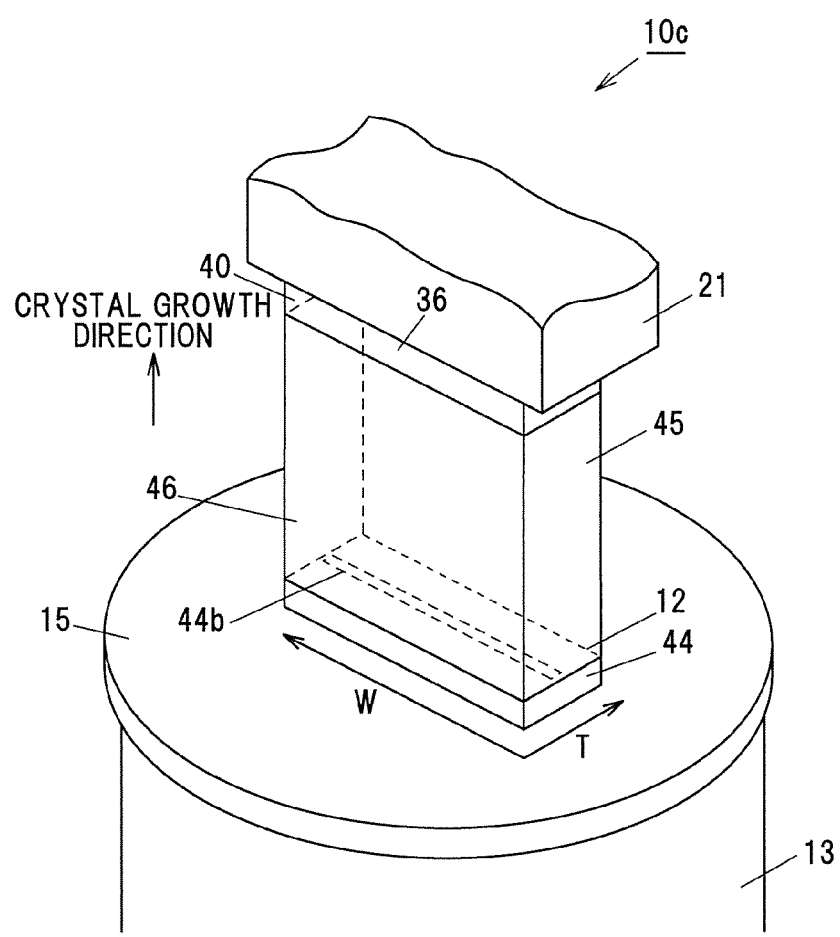
FIG. 8 is a perspective view showing a state during growth of a new β-Ga₂O₃-based single crystal using a seed crystal cut out from the β-Ga₂O₃-based single crystal in the embodiment.

FIG. 8 is a perspective view showing a state during growth of a new β-Ga$_2$O$_3$-based single crystal 45 using a seed crystal 40 cut out from the β-Ga$_2$O$_3$-based single crystal 35.

The seed crystal 40 is a β-Ga$_2$O$_3$-based single crystal which is cut out from a flat plate-shaped region of the β-Ga$_2$O$_3$-based single crystal 35 and does not contain or hardly contains twins. The seed crystal 40 is obtained by, e.g., cutting the flat plate-shaped region of the β-Ga$_2$O$_3$-based single crystal 35 along a plane perpendicular to the growth direction of the β-Ga$_2$O$_3$-based single crystal 35, and has width and thickness equal to those of the β-Ga$_2$O$_3$-based single crystal 35.

By using the seed crystal 40, a thick β-Ga$_2$O$_3$-based single crystal 45 allowing many substrates to be cut out can be repeatedly grown without widening the shoulder in the width direction W and the thickness direction T.

Since the growth of the β-Ga$_2$O$_3$-based single crystal 45 does not involve a process of widening the shoulder in the width direction W, twinning of the β-Ga$_2$O$_3$-based single crystal 45 is suppressed. In addition, since the growth of the β-Ga$_2$O$_3$-based single crystal 45 also does not involve a process of widening the shoulder in the thickness direction T, substantially the entire β-Ga$_2$O$_3$-based single crystal 45 becomes a flat plate-shaped region to be cut into substrates, allowing the running cost of substrate production to be reduced.

Since the shoulder of the β-Ga$_2$O$_3$-based single crystal 45 is not widened in the width direction W and in the thickness direction T, the width and thickness of a die 44 may be equal to those of the die 34, and the die 34 may be used as the die 44.

By growing the β-Ga$_2$O$_3$-based single crystal 45 in a state that the principal surface 36 of the seed crystal 40 is perpendicular to the horizontal plane, the plane orientation of a principal surface 46 of the β-Ga$_2$O$_3$-based single crystal 45 can be made to coincide with the plane orientation of the principal surface 36 of the β-Ga$_2$O$_3$-based single crystal 35. For example, by using the seed crystal 40 cut out from the β-Ga$_2$O$_3$-based single crystal 35 having the principal surface 36 oriented to (101), (−201) or (001), it is possible to grow the β-Ga$_2$O$_3$-based single crystal 45 having the principal surface 46 oriented to (101), (−201) or (001).

The following is an example of a method of producing a β-Ga$_2$O$_3$-based single-crystal substrate from the grown β-Ga$_2$O$_3$-based single crystal 45.

FIG. 9 is a flowchart showing an example of a process of producing a β-Ga$_2$O$_3$-based single-crystal substrate. The process will be described below with the flowchart.

Firstly, the β-Ga₂O₃-based single crystal 45 having a thickness of, e.g., 18 mm is grown and is then annealed to relieve thermal stress during single crystal growth and to improve electrical characteristics (Step S1). The atmosphere used is preferably a nitrogen atmosphere but may be another inactive atmosphere such as argon or helium. Annealing holding temperature is preferably a temperature of 1400 to 1600° C. Annealing time at the holding temperature is preferably about 6 to 10 hours.

Next, the seed crystal 40 and the β-Ga₂O₃-based single crystal 45 are separated by cutting with a diamond blade (Step S2). Firstly, the β-Ga₂O₃-based single crystal 45 is fixed to a carbon stage via heat-melting wax. The β-Ga₂O₃-based single crystal 45 fixed to the carbon stage is set on a cutting machine and is cut for separation. The grit number of the blade is preferably about #200 to #600 (defined by JIS B 4131) and a cutting rate is preferably about 6 to 10 mm per minute. After cutting, the β-Ga₂O₃-based single crystal 45 is detached from the carbon stage by heating.

Next, the edge of the β-Ga₂O₃-based single crystal 45 is shaped into a circular shape by an ultrasonic machining device or a wire-electrical discharge machine (Step S3). An orientation flat(s) can be additionally formed at a desired position(s) of the edge.

Next, the circularly-shaped β-Ga₂O₃-based single crystal 45 is sliced to about 1 mm thick by a multi-wire saw, thereby obtaining a β-Ga₂O₃-based single crystal substrate (Step S4). In this process, it is possible to slice at a desired offset angle. It is preferable to use a fixed-abrasive wire saw. A slicing rate is preferably about 0.125 to 0.3 mm per minute.

Next, the β-Ga₂O₃-based single crystal substrate is annealed to reduce processing strain and to improve electrical characteristics as well as permeability (Step S5). The annealing is performed in an oxygen atmosphere during temperature rise and is performed in a nitrogen atmosphere when holding temperature after the temperature rise. The atmosphere used when holding the temperature may be another inactive atmosphere such as argon or helium. The holding temperature is preferably 1400 to 1600° C.

Next, the edge of the β-Ga₂O₃-based single crystal substrate is chamfered (or beveled) at a desired angle (Step S6).

Next, the β-Ga₂O₃-based single crystal substrate is ground to a desired thickness by a diamond abrasive grinding wheel (Step S7). The grit number of the grinding wheel is preferably about #800 to #1000 (defined by JIS B 4131).

Next, the β-Ga₂O₃-based single crystal substrate is polished to a desired thickness using a turntable and diamond slurry (Step S8). It is preferable to use a turntable formed of a metal-based or glass-based material. A grain size of the diamond slurry is preferably about 0.5 μm.

Next, the β-Ga₂O₃-based single crystal substrate is polished using a polishing cloth and CMP (Chemical Mechanical Polishing) slurry until atomic-scale flatness is obtained (Step S9). The polishing cloth formed of nylon, silk fiber or urethane, etc., is preferable. Slurry of colloidal silica is preferably used. The principal surface of the β-Ga₂O₃-based single crystal substrate after the CMP process has a mean roughness of about Ra=0.05 to 0.1 nm.

A substrate may be directly cut out from the β-Ga₂O₃-based single crystal 35 without using the seed crystal 40. However, in such a case, it is necessary to widen the shoulder in the thickness direction T each time the β-Ga₂O₃-based single crystal 35 is grown as a single crystal to be cut into a substrate. Since a substrate cannot be cut out from a widened shoulder portion, there is a problem of an increase in the running cost when mass producing substrates.

On the other hand, when the single crystal to be cut into a substrate does not need to be thick, the β-Ga₂O₃-based single crystal 35 grown without widening the shoulder in the thickness direction T may be cut into a substrate.

Meanwhile, in case that the width and thickness of the die 14 and the size of the crucible 13 or the lid 15 are increased, the β-Ga₂O₃-based single crystal 25 can be grown while widening the shoulder in the width direction W and the thickness direction T and a wide and thick seed crystal thus can be cut out from such a β-Ga₂O₃-based single crystal 25. In this method, however, a huge cost is required since a very expensive material such as iridium is used to form the crucible 13, the die 14 and the lid 15. Therefore, forming a wide β-Ga₂O₃-based seed crystal not containing or hardly containing twins by the growth method of the present embodiment is more preferable.

Effects of the Embodiment

According to the embodiment, it is possible to form a wide β-Ga₂O₃-based seed crystal not containing or hardly containing twins. By using such a wide seed crystal, a flat plate-shaped β-Ga₂O₃-based single crystal to be cut into a substrate can be grown while minimizing the shoulder widening in the width direction. This allows a high-quality β-Ga₂O₃-based single crystal substrate to be produced.

Further, please note that all combinations of the features described in the embodiment are not necessary to solve the problem of the invention.

INDUSTRIAL APPLICABILITY

Provided are a method for growing a β-Ga₂O₃-based single crystal by which it is possible to obtain a wide β-Ga₂O₃-based seed crystal to be used in growth of a flat plate-shaped β-Ga₂O₃-based single crystal with the minimized widening of the shoulder in the width direction, a β-Ga₂O₃-based single crystal substrate using the same, and a method for producing the same.

REFERENCE SIGNS LIST

12: Ga₂O₃-BASED MELT
13: CRUCIBLE
14, 34, 44: DIE
20, 30, 40: SEED CRYSTAL
25, 35, 45: β-Ga₂O₃-BASED SINGLE CRYSTAL
T: THICKNESS DIRECTION
W: WIDTH DIRECTION

The invention claimed is:

1. A method for growing a β-Ga₂O₃-based single crystal, comprising:
   using EFG method;
   raising a Ga₂O₃-based melt inside a crucible up to an opening of a die via a slit of the die such that a seed crystal is contacted with the Ga₂O₃-based melt in the opening of the die with a horizontal position of the seed crystal shifted in a width direction from a center in the width direction of the die; and
   pulling up the seed crystal contacting the Ga₂O₃-based melt so as to grow a β-Ga₂O₃-based single crystal, wherein the grown β-Ga₂O₃-based single crystal comprises three portions, a first portion being a same width as that of the seed crystal, a second portion having a width greater than the first portion, and a third portion being the same width as the die.

2. The method for cultivating a β-$Ga_2O_3$-based single crystal according to claim 1, wherein the seed crystal is contacted with the $Ga_2O_3$-based melt in the opening of the die with the horizontal position of the seed crystal located above an edge of the die in the width direction.

3. The method for cultivating a β-$Ga_2O_3$-based single crystal according to claim 1, wherein the β-$Ga_2O_3$-based single crystal is grown in a b-axis direction.

4. The method for cultivating a β-$Ga_2O_3$-based single crystal according to claim 1, wherein the β-$Ga_2O_3$-based single crystal comprises a flat plate-shaped single crystal having a (101) plane, a (−201) plane or a (001) plane as a principal surface.

5. The method for cultivating a β-$Ga_2O_3$-based single crystal according to claim 1, further comprising:
cutting out a second seed crystal from the β-$Ga_2O_3$-based single crystal;
raising a second $Ga_2O_3$-based melt inside a second crucible up to an opening of a second die via a slit of the second die such that the second seed crystal is contacted with the second $Ga_2O_3$-based melt in the opening of the second die; and
pulling up the second seed crystal contacting the second $Ga_2O_3$-based melt so as to grow a second β-$Ga_2O_3$-based single crystal to be a flat plate-shaped after widening the shoulder in the thickness direction.

6. The method for cultivating a β-$Ga_2O_3$-based single crystal according to claim 5, wherein the second seed crystal is cut out from a region between a first region and one of two edges of the β-$Ga_2O_3$-based single crystal in the width direction that is located farther from the first region, the first region being located immediately below the seed crystal during the growth of the β-$Ga_2O_3$-based single crystal.

7. The method for cultivating a β-$Ga_2O_3$-based single crystal according to claim 5, further comprising:
cutting out a third seed crystal from the second β-$Ga_2O_3$-based single crystal;
raising a third $Ga_2O_3$-based melt inside a third crucible up to an opening of a third die via a slit of the third die such that the third seed crystal is contacted with the third $Ga_2O_3$-based melt in the opening of the third die; and
pulling up the third seed crystal contacting the third $Ga_2O_3$-based melt so as to grow a third β-$Ga_2O_3$-based single crystal.

8. A method for producing a β-$Ga_2O_3$-based single crystal substrate, comprising processing the second β-$Ga_2O_3$-based single crystal according to claim 5 into a β-$Ga_2O_3$-based single crystal substrate.

9. A method for producing a β-$Ga_2O_3$-based single crystal substrate, comprising processing the third β-$Ga_2O_3$-based single crystal according to claim 7 into a β-$Ga_2O_3$-based single crystal substrate.

10. The method for cultivating a β-$Ga_2O_3$-based single crystal according to claim 2, wherein the β-$Ga_2O_3$-based single crystal is grown in a b-axis direction.

11. The method for cultivating a β-$Ga_2O_3$-based single crystal according to claim 2, wherein the β-$Ga_2O_3$-based single crystal comprises a flat plate-shaped single crystal having a (101) plane, a (−201) plane or a (001) plane as a principal surface.

12. The method for cultivating a β-$Ga_2O_3$-based single crystal according to claim 2, further comprising:
cutting out a second seed crystal from the β-$Ga_2O_3$-based single crystal;
raising a second $Ga_2O_3$-based melt inside a second crucible up to an opening of a second die via a slit of the second die such that the second seed crystal is contacted with the second $Ga_2O_3$-based melt in the opening of the second die; and
pulling up the second seed crystal contacting the second $Ga_2O_3$-based melt so as to grow a second β-$Ga_2O_3$-based single crystal to be a flat plate-shaped after widening the shoulder in the thickness direction.

13. The method for cultivating a β-$Ga_2O_3$-based single crystal according to claim 12, wherein the second seed crystal is cut out from a region between a first region and one of two edges of the β-$Ga_2O_3$-based single crystal in the width direction that is located farther from the first region, the first region being located immediately below the seed crystal during the growth of the β-$Ga_2O_3$-based single crystal.

14. The method for cultivating a β-$Ga_2O_3$-based single crystal according to claim 12, further comprising:
cutting out a third seed crystal from the second β-$Ga_2O_3$-based single crystal;
raising a third $Ga_2O_3$-based melt inside a third crucible up to an opening of a third die via a slit of the third die such that the third seed crystal is contacted with the third $Ga_2O_3$-based melt in the opening of the third die; and
pulling up the third seed crystal contacting the third $Ga_2O_3$-based melt so as to grow a third β-$Ga_2O_3$-based single crystal.

15. A method for producing a β-$Ga_2O_3$-based single crystal substrate, comprising processing the second β-$Ga_2O_3$-based single crystal according to claim 12 into a β-$Ga_2O_3$-based single crystal substrate.

* * * * *